United States Patent [19]
Hamburgen

[11] Patent Number: 5,198,753
[45] Date of Patent: Mar. 30, 1993

[54] INTEGRATED CIRCUIT TEST FIXTURE AND METHOD

[75] Inventor: William R. Hamburgen, Menlo Park, Calif.

[73] Assignee: Digital Equipment Corporation, Maynard, Mass.

[21] Appl. No.: 546,523

[22] Filed: Jun. 29, 1990

[51] Int. Cl.$^5$ .................... G01R 35/00; G01R 31/06
[52] U.S. Cl. ........................ 324/158 F; 324/158 P; 165/80.4
[58] Field of Search ............. 324/158 F, 158 P, 72.5, 324/158 R, 73.1; 165/80.4, 80.5; 269/21; 279/3; 437/8

[56] References Cited

U.S. PATENT DOCUMENTS

| | | | |
|---|---|---|---|
| 3,710,251 | 1/1973 | Hagge et al. | 324/158 P |
| 3,979,671 | 9/1976 | Meeker et al. | 324/158 F |
| 4,104,589 | 8/1978 | Baker et al. | 324/158 F |
| 4,567,432 | 1/1986 | Buol et al. | 324/158 F |
| 4,791,364 | 12/1988 | Kufis et al. | 324/158 F |
| 4,820,976 | 4/1989 | Brown | 324/158 P |
| 4,884,027 | 11/1989 | Holderfield et al. | 324/158 F |
| 4,954,774 | 9/1990 | Binet | 324/158 R |
| 4,982,153 | 1/1991 | Collins et al. | 324/158 F |
| 5,001,423 | 3/1991 | Abrami et al. | 324/158 F |

FOREIGN PATENT DOCUMENTS 0131375 1/1985 European Pat. Off. .

OTHER PUBLICATIONS

Perry; "Measurement of Physical and Chemical Characteristics"; Chemical Engineers' handbook; p. 1303; 1950.

IBM Technical Disclosure Bulletin, vol. 32, No. 1, Jun. 1988, pp. 462–464, "Electrostatic Wafer Holder for Wafer Cooling During Reactive Ion Etching".

*Primary Examiner*—Vinh Nguyen
*Attorney, Agent, or Firm*—Flehr, Hohbach, Test, Albritton & Herbert

[57] ABSTRACT

A test fixture (10) for integrated circuits includes a wafer chuck (12). The chuck (12) has a plurality of concentrically arranged vacuum hold down rings (14) which communicate with top (18) of the chuck (12). Between the hold down rings (14) are a plurality of concentrically arranged helium gas supply rings (20), connected to a source of helium gas (22), and also communicating with top (18) of the chuck (12). An integrated circuit wafer (24) is mounted on the top (18) of the chuck (12), held in place by the vacuum hold down rings (14). Helium has a thermal conductivity five times that of air. Flow of helium gas in the helium supply rings (20) between the wafer (24) and the chuck (12) therefore reduces the interface thermal resistance between the wafer (24) and the chuck (12) as much as five times. A coolant supply tube (32) extends through the probe card (26), terminating proximate to the wafer (24), and is connected to a source of coolant (33), to assist the cooling.

36 Claims, 3 Drawing Sheets

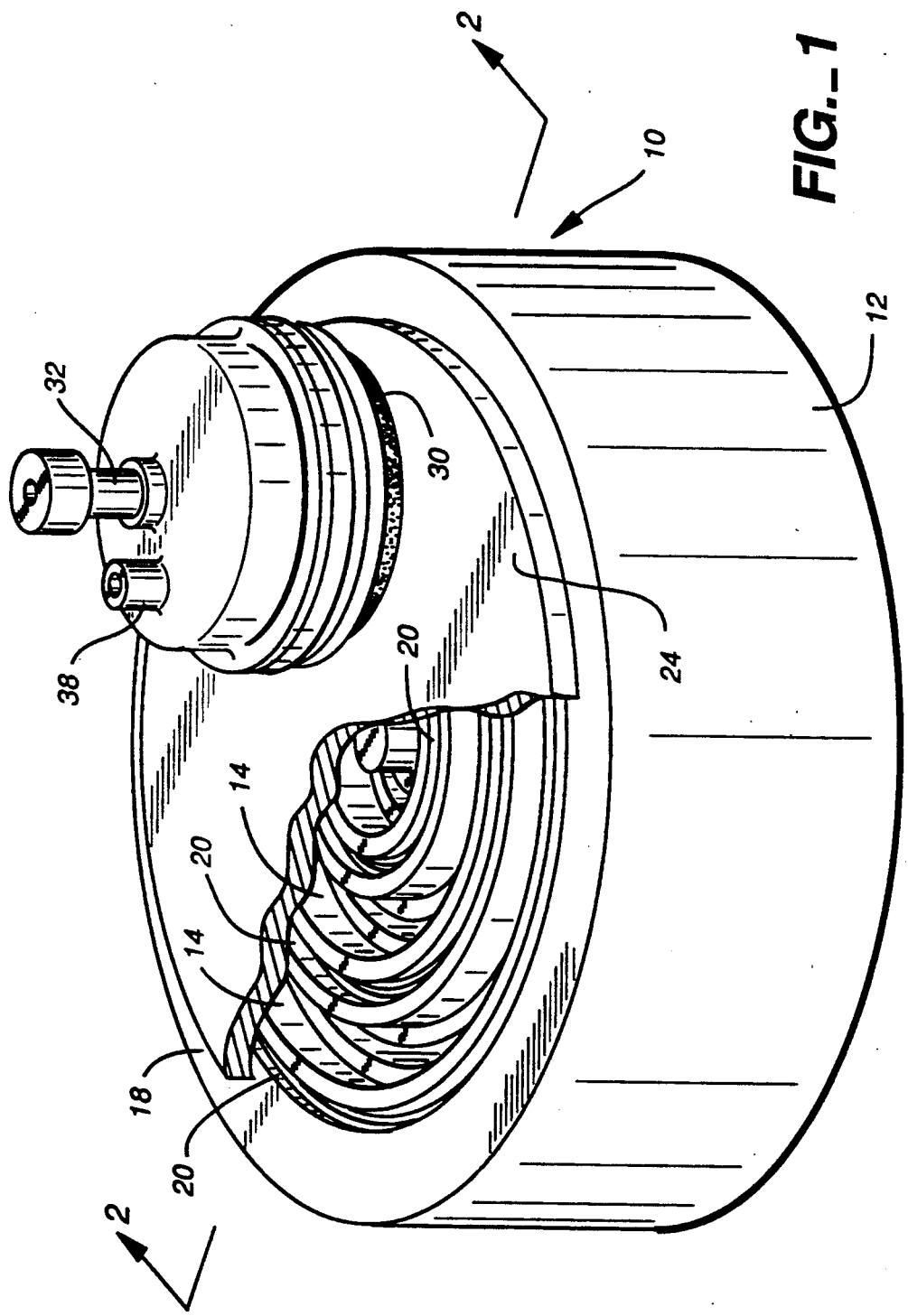
FIG._1

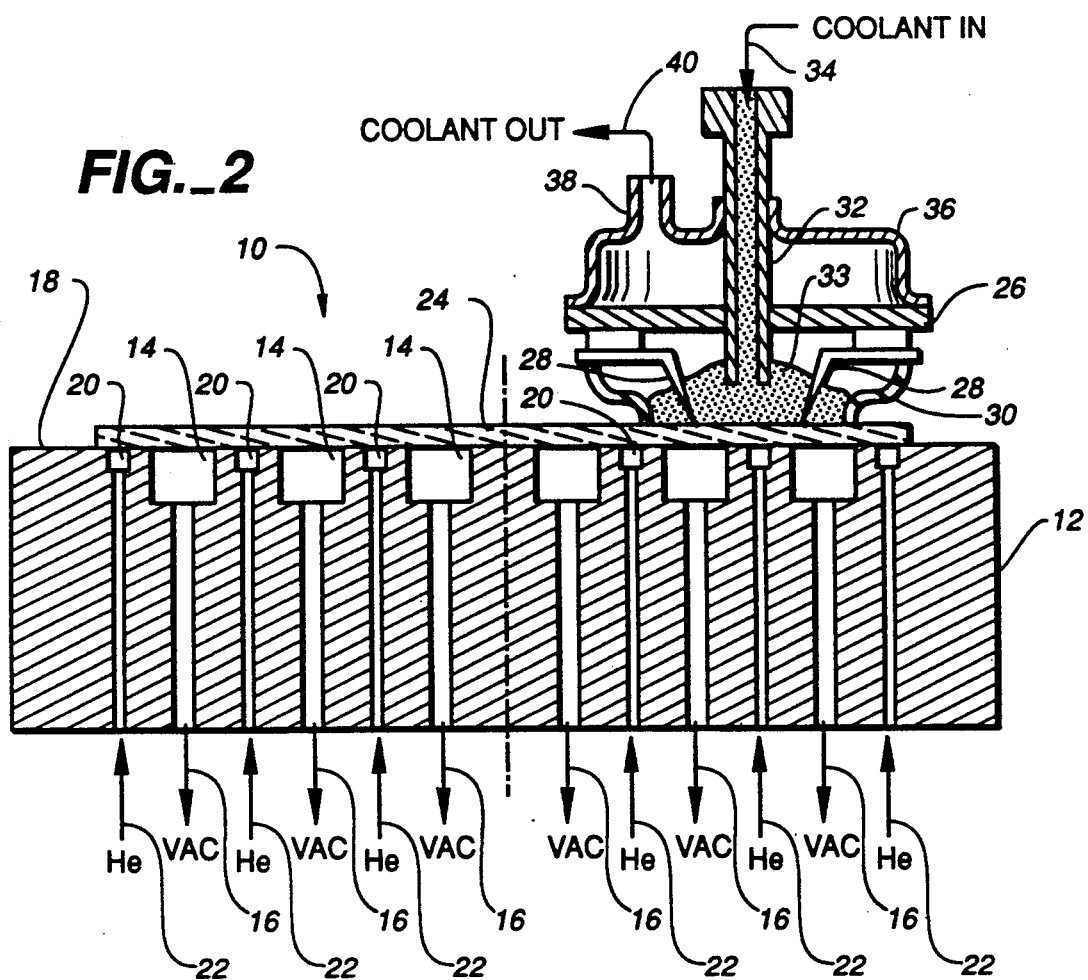
FIG._2
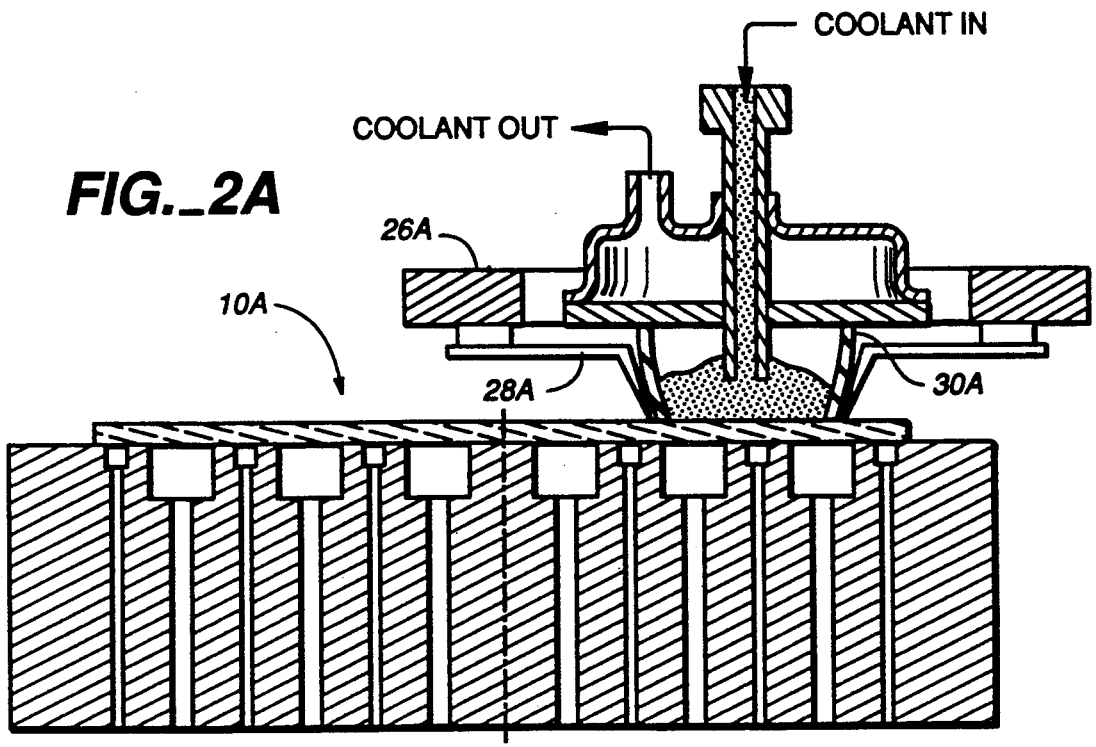
FIG._2A

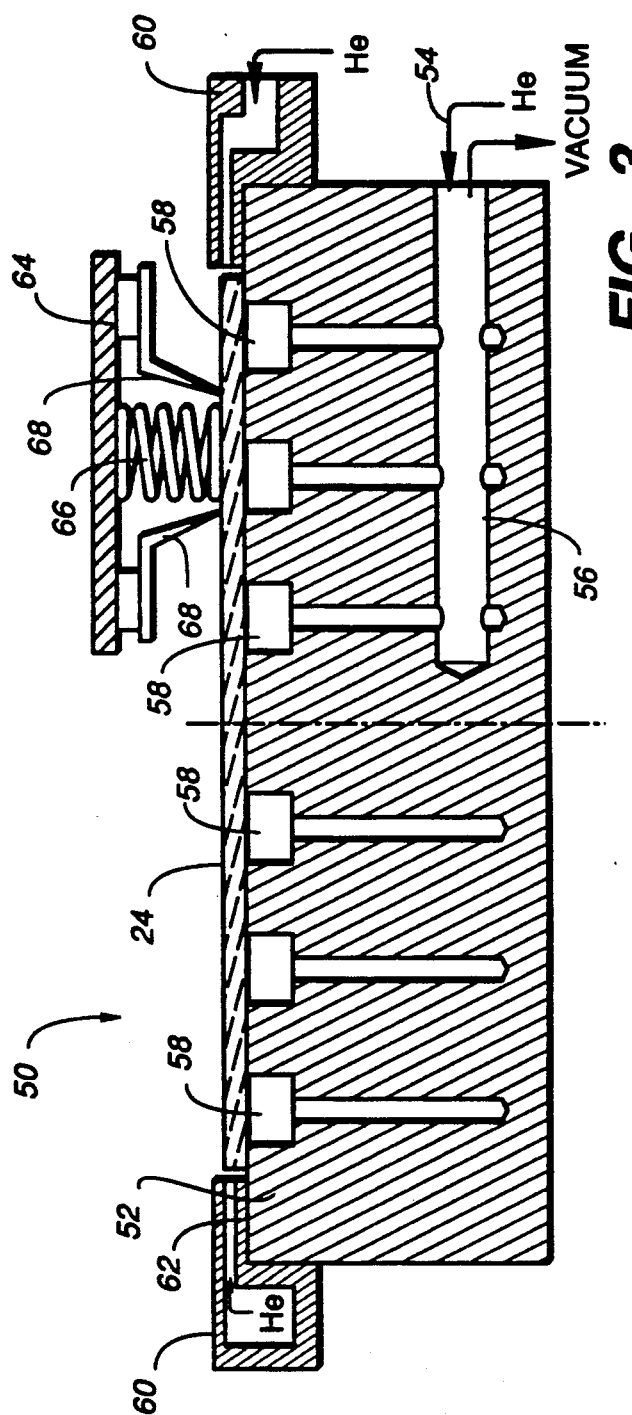

INTEGRATED CIRCUIT TEST FIXTURE AND METHOD

BACKGROUND OF THE INVENTION

1. Field of the Invention

The present invention relates generally to an integrated circuit test fixture and method incorporating fluid cooling of the integrated circuit during testing. More particularly, it relates to such a fixture and method which utilizes a high thermal conductivity gas and/or a cooling fluid. Most especially, the invention relates to such a fixture and method which will allow high powered integrated circuits to be tested while running the integrated circuits continuously prior to being separated from a wafer.

2. Description of the Prior Art

High powered integrated circuit chips, such as emitter coupled logic (ECL) chips, require a large quantity of electrical power, which is converted and dissipated as heat. For example, at a typical power dissipation level of 30 watts/cm$^2$ for ECL, the temperature of an isolated die will rise at 300 degrees C./second of applied power in the absence of any method to remove the generated heat. To enable testing while still in wafer form, pulsed power testing is often used. A die site on the wafer is probed, and power is applied only for a fraction of a second. There is some heat sinking to adjacent silicon of the wafer and to the wafer chuck of the probing station, so short tests can be run without burning up the chip.

More advanced ECL chips now under development, such as high speed microprocessor chips, will have a much higher watt density, such as almost 60 watts/cm$^2$. In the future, integrated circuits having watt densities of 100 watts/cm$^2$ or higher will be developed. Such microprocessor chips also will desirably employ a clocking scheme that would complicate designing the chip for pulsed power testing. It is therefore desired to run the chip continuously at full power during testing. Such a capability would be desirable in almost any ECL probing application.

It is known in the art to provide coolant fluids, such as an inert liquid that is boiled to remove heat from packaged integrated circuits. It is also known to use helium as a thermal conductivity enhancer between two members. It is further known to test such packaged integrated circuits and circuit boards by immersing them in the inert liquid. Such techniques have hitherto not been adapted for use in a test fixture for integrated circuits still in wafer form. It is further known to pass water through passages in a wafer chuck to chill the chuck, but the current state of the art does not remove enough power from high power density integrated circuits to allow them to be operated at full, continuous power, with low operating temperature, because it is hard to get good enough thermal contact to exploit fully water cooling.

SUMMARY OF THE INVENTION

An integrated circuit test fixture in accordance with this invention has a chuck for holding the integrated circuit. A probe is positioned over the chuck and has a plurality of electrically conductive tip elements for supplying electrical signals to and receiving electrical signals from the integrated circuit. A means thermally contacts the integrated circuit with a high thermal conductivity heat transfer interface fluid while the integrated circuit is held by the chuck.

An integrated circuit test method in accordance with this invention includes holding the integrated circuit in a chuck. A probe having a plurality of electrically conductive tip elements is positioned over the chuck with the tip elements electrically connected to the integrated circuit. The integrated circuit is contacted with a high thermal conductivity heat transfer interface fluid while the integrated circuit is held by the chuck. Continuous, full operating power is supplied to the integrated circuit through selected ones of the electrically conductive tip elements. Electrical signals are supplied to and received from the integrated circuit through other electrically conductive tip elements.

The attainment of the foregoing and related advantages and features of the invention should be more readily apparent to those skilled in the art, after review of the following more detailed description of the

BRIEF DESCRIPTION OF THE DRAWINGS

FIG. 1 is a perspective view of a test fixture for integrated circuits in accordance with the invention, with a partial cutaway to show interior detail.

FIG. 2 is a cross-section view, taken along the line 2—2 in FIG. 1.

FIG. 2A is a cross-section view, similar to that of FIG. 2, but of a second embodiment of a test fixture for integrated circuits in accordance with the invention FIG. 3 is a cross-section view, similar to that of FIG. 2, but of a third embodiment of a test fixture for integrated circuits in accordance with the invention.

DETAILED DESCRIPTION OF THE INVENTION

Turning now to the drawings, more particularly to FIGS. 1 and 2, there is shown a test fixture 10 for integrated circuits. The fixture 10 includes a wafer chuck 12 formed from a a suitable metal, such as aluminum or copper and containing a plurality of water cooling channels (not shown). The chuck 12 has a plurality of concentrically arranged vacuum hold down rings 14, which are connected to a vacuum pump, as indicated at 16, and which communicate with top 18 of the chuck 12. Between the hold down rings 14 are a plurality of concentrically arranged helium gas supply rings 20, connected to a source of helium gas, as indicated at 22, and also communicating with top 18 of the chuck 12. A semiconductor (e.g., silicon) integrated circuit wafer 24 is mounted on the top 18 of the chuck 12, held in place by the vacuum hold down rings 14.

A probe card 26 having a plurality of probes 28 for making electrical connection with contact pads on integrated circuits in the wafer 24 is positioned over the wafer 24. A boot seal 30 concentrically surrounds the probes 28. A liquid coolant supply tube 32 extends through the probe card 26, terminating proximate to the wafer 24, and is connected to a source of fluorocarbon coolant 33, as indicated at 34. A shroud 36 extends over the probe card 26, and in combination with the boot seal 30, serves to confine the fluorocarbon coolant 33 and its vapor. A coolant vapor port 38 is connected to a condenser, as indicated at 40, for recovery of the coolant vapor. In addition to the fluorocarbon coolant, cooled air, liquid nitrogen or another cooling fluid, either using a phase change or not using a phase change as part of its cooling action, could be employed with appropriate modification of the test fixture 10.

In use of the test fixture 10, power for operating an integrated circuit in the wafer 24 under test, and test signals are supplied on selected ones of the probes 28. Inputs to and output signals from the integrated circuit are supplied on other ones of the probes 28. Instead of supplying pulse power for operating the integrated circuit, as is conventional for ECL and other high power integrated circuits, continuous, full power is employed during probing. Helium has a thermal conductivity five times that of air. Helium gas in the cooling rings 20 between the wafer 24 and the chuck 12 therefore reduces the interface thermal resistance as much as five times. Hydrogen gas could also be used, but is less attractive because of its explosive potential.

Regulation of the vacuum holding the wafer 24 against the chuck 12 and the quantity of the helium gas supplied to the chuck 12 is needed to maintain the conductivity of the helium at a high level. While the conductivity of the helium remains constant over a substantial pressure range, the conductivity is reduced for low pressures in small gaps.

For the highest watt density integrated circuits, the enhanced cooling obtained by providing the high thermal conductivity gas interface may still not remove enough heat to allow full power operation of such integrated circuits. The fluorocarbon liquid coolant 33 will remove an additional portion of the heat generated by such circuits by nucleate boiling on the active face of the integrated circuit chip. A suitable specific example of the liquid coolant 33 is FLUORINERT brand perfluorinated liquid, obtainable from 3M Corporation, St. Paul, Minn. This technique is able to handle heat removal corresponding to as much as 20 to 40 watts/cm$^2$ of power density. A 60 watts/cm$^2$ power density integrated circuit chip therefore requires both techniques to allow full, continuous power during testing. By providing multijet impingement of the liquid coolant 33 on the integrated circuit, sufficient heat removal may be obtained to handle a power density of over 100 watts/cm$^2$. Recovery of the liquid coolant vapor by condensation and re-use both avoids environmental contamination and reduces cost significantly, since such cooling fluids typically cost over $20.00 per pound.

FIG. 2A shows a test fixture 10a in which probes 28a are outside of boot seal 30a. This arrangement is less likely to require modification of a conventional probe card 26a to utilize the invention than the test fixture 10 of FIG. 2. Other than as shown and described, the construction and operation of the FIG. 2A embodiment of the invention is the same as that of the FIG. 2 embodiment.

FIG. 3 shows a test fixture 50 utilizing a conventional water cooled vacuum chuck 52 that has been modified by the addition of a helium gas source, indicated at 54, connected to vacuum manifold 56. The vacuum manifold 56 is connected to hold down rings 58, which are similar in construction to the hold down rings 14 in the FIG. 1 embodiment. A helium gas purge 60 is attached to top 62 of the vacuum chuck 52 to provide an edge helium purge feed around the entire edge of the wafer 24. Even though a vacuum is being pulled through the vacuum manifold, backdiffusion of the helium gas into the hold down rings 58 is adequate to provide enhanced thermal conductivity between the wafer 24 and the vacuum chuck 52 because gases have the interesting property of having constant thermal conductivity over a wide range of pressures. However, dilution of the helium with air substantially reduces the thermal conductivity of the helium, necessitating adequate helium flow rates. The helium gas purge 60 prevents air from being bled into the hold down rings 58 and vacuum manifold 56, in addition to providing additional helium in them to that provided by the backdiffusion. Probe card 64 may be modified by the addition of a spring 66 or other biasing means to increase the joint pressure between the wafer 24 and the chuck 52 as the probe card 64 is pressed against the wafer 24 to establish electrical connection to the integrated circuit with probes 68. Other than as shown and described, the construction and operation of the FIG. 3 embodiment of the invention is the same as that of the FIG. 2 embodiment.

It should be apparent to those skilled in the art that various changes in form and details of the invention as shown and described may be made. It is intended that such changes be included within the spirit and scope of the claims appended hereto.

What is claimed is:

1. An integrated circuit test fixture, which comprises a chuck for holding a wafer containing the integrated circuit, a probe positioned over said chuck and having a plurality of electrically conductive tip elements for supplying electrical signals to and receiving electrical signals from the integrated circuit, a power source connected to said probe for supplying continuous, full operating power to the integrated circuit through selected noes of the electrically conductive tip elements, gas supply means for thermally contacting the integrated circuit and said chuck with a hydrogen or helium high thermal conductivity relative to air heat transfer interface gas to reduce interface thermal resistance between the integrated circuit and said chuck while the integrated circuit is held by said chuck, and liquid supply means for thermally contacting said integrated circuit with a cooling liquid.

2. The integrated circuit test fixture of claim 1 in which said means for thermally contacting the integrated circuit comprises at least one duct in said chuck and a source of the cooling liquid, said source being connected to said at least one duct.

3. The integrated circuit test fixture of claim 1 in which said test fixture additionally comprises pump, said vacuum pump and said at least one duct comprising a means for holding the integrated circuit on said chuck.

4. The integrated circuit test fixture of claim 1 additionally comprising means for supplying the hydrogen or helium high thermal conductivity relative to air heat transfer interface gas as a purging gas around an edge of the wafer.

5. An integrated circuit test fixture, which comprises a chuck for holding a wafer containing the integrated circuit, a probe positioned over said chuck and having a plurality of electrically conductive tip elements for supplying electrical signals to and receiving electrical signals from the integrated circuit, gas supply means for thermally contacting the integrated circuit and said chuck with a hydrogen or helium gas high thermal conductivity relative to air heat transfer interface fluid to reduce interface thermal resistance between the integrated circuit and said chuck while the integrated circuit is held by said chuck, and a means for thermally contacting the integrated circuit with a cooling fluid, said probe having a tube terminating proximate to said plurality of tip elements and said integrated circuit test fixture including a source of the cooling fluid connected to said tube, said means for thermally contacting the integrated circuit with the cooling fluid additionally comprising said tube and said source of the cooling fluid.

6. The integrated circuit test fixture of claim 5 in which the cooling fluid is a fluorinated organic liquid.

7. An integrated circuit test fixture, which comprises a chuck for holding a wafer containing the integrated circuit, a probe positioned over said chuck and having a plurality of electrically conductive tip elements for supplying electrical signals to and receiving electrical signals from the integrated circuit, means for thermally contacting the integrated circuit and said chuck with a hydrogen or helium gas high thermal conductivity heat transfer interface fluid while the integrated circuit is held by said chuck, and a means for thermally contacting the integrated circuit with a cooling fluid, said probe having a tube terminating proximate to said plurality of tip elements and said integrated circuit test fixture including a source of the cooling fluid connected to said tube, said means for thermally contacting the integrated circuit with the cooling fluid additionally comprising said tube and said source of the cooling fluid, and a seal mounted on said probe and configured for sealing engagement around a periphery of the integrated circuit.

8. The integrated circuit test fixture of claim 7 in which said seal circumscribes said plurality of electrically conductive tip elements.

9. The integrated circuit test fixture of claim 7 additionally comprising a fluid coolant vapor shroud on said probe over said plurality of tip elements, a duct through said shroud, and a condenser for the fluid coolant vapor connected to said duct.

10. An integrated circuit test fixture, which comprises a chuck for holding a wafer containing the integrated circuit, a probe positioned over said chuck and having a plurality of electrically conductive tip elements for supplying electrical signals to and receiving electrical signals from the integrated circuit, means for thermally contacting the integrated circuit and said chuck with a hydrogen or helium gas high thermal conductivity heat transfer interface fluid while the integrated circuit is held by said chuck, and means for thermally contacting the integrated circuit with a cooling fluid, said probe having a tube terminating proximate to said plurality of tip elements and said integrated circuit test fixture including a source of the cooling fluid connected to said tube, said means for thermally contacting the integrated circuit with the cooling fluid additionally comprising said tube and said source of the cooling fluid, and a seal coupled to said tube of said means for thermally contacting the integrated circuit with the cooling fluid and configured for sealing engagement around a periphery of the integrated circuit, in which said plurality of electrically conductive tip elements circumscribe said seal.

11. An integrated circuit test fixture, which comprises a chuck for holding a wafer containing the integrated circuit, a probe positioned over said chuck and having a plurality of electrically conductive tip elements for supplying electrical signals to and receiving electrical signals from the integrated circuit, means for thermally contacting the integrated circuit and said chuck with a hydrogen or helium gas high thermal conductivity heat transfer interface fluid while the integrated circuit is held by said chuck, and a means for thermally contacting the integrated circuit with a cooling fluid, the cooling fluid comprising a liquid.

12. An integrated circuit test fixture, which comprises a chuck for holding a wafer containing the integrated circuit, a probe positioned over said chuck and having a plurality of electrically conductive tip elements for supplying electrical signals to and receiving electrical signals from the integrated circuit, a power source connected to said probe for supplying continuous, full operating power to the integrated circuit through selected ones of the electrically conductive tip elements, gas supply means for thermally contacting the integrated circuit and said chuck with a Hydrogen or Helium high thermal conductivity relative to air heat transfer interface gas to reduce interface thermal resistance between the integrated circuit and said chuck while the integrated circuit is held by said chuck, and liquid supply means for thermally contacting said integrated circuit with a cooling liquid, the high thermal conductivity relative to air gas being supplied as a gas in a vacuum plenum and vacuum passages in said chuck for holding the wafer in the chuck.

13. An integrated circuit test fixture, which comprises a chuck for holding a wafer containing the integrated circuit, a probe positioned over said chuck and having a plurality of electrically conductive tip elements for supplying electrical signals to and receiving electrical signals from the integrated circuit, and means for thermally contacting the integrated circuit and said chuck with a Hydrogen or Helium high thermal conductivity heat transfer interface fluid while the integrated circuit is held by said chuck, said probe including a biasing means for contacting the wafer to provide increased contact force between the wafer and said chuck.

14. An integrated circuit test fixture, which comprises a chuck for holding a wafer containing the integrated circuit, a probe positioned over said chuck and having a plurality of electrically conductive tip elements for supplying electrical signals to and receiving electrical signals from the integrated circuit, and means for thermally contacting a top surface of the integrated circuit with a cooling liquid while the integrated circuit is held by said chuck.

15. The integrated circuit test fixture of claim 14 in which said means for thermally contacting the integrated circuit comprises a tube terminating proximate to said plurality of tip elements and a source of the liquid connected to said tube.

16. The integrated circuit test fixture of claim 14 in which the liquid is fluorinated organic liquid.

17. The integrated circuit test fixture of claim 14 additionally comprising a seal mounted on said probe and configured for sealing engagement around a periphery of the integrated circuit.

18. The integrated circuit test fixture of claim 17 in which said seal circumscribes said plurality of electrically conductive tip elements.

19. The integrated circuit test fixture of claim 17 additionally comprising a fluid coolant vapor shroud on said probe over said plurality of tip elements, a duct through said shroud, and a condenser for the fluid coolant vapor connected to said duct.

20. The integrated circuit test fixture of claim 14 additionally comprising a seal mounted to said means for thermally contacting the integrated circuit with the cooling liquid and configured for sealing engagement around a periphery of the integrated circuit, in which said plurality of electrically conductive tip elements circumscribe said seal.

21. An integrated circuit test method, which comprises holding the integrated circuit in a chuck, positioning a probe having a plurality of electrically conductive tip elements over the chuck with the tip elements electrically connected to the integrated circuit, thermally contacting the integrated circuit and the chuck with a hydrogen or helium high thermal conductivity relative to air heat transfer interface gas to reduce interface thermal resistance between the integrated circuit and the chuck while the integrated circuit is held by the chuck, supplying continuous, full operating power to the integrated circuit through selected ones of the electrically conductive tip elements, supplying electrical signals to and receiving electrical signals from the integrated circuit through the electrically conductive tip elements, and contacting a top of the integrated circuit with a cooling liquid through the probe.

22. An integrated circuit test method, which comprises holding the integrated circuit in a chuck, positioning a probe having a plurality of electrically conductive tip elements over the chuck with the tip elements electrically connected to the integrated circuit, thermally contacting the integrated circuit and the chuck with a hydrogen or helium high thermal conductivity heat transfer interface fluid while the integrated circuit is held by the chuck, supplying continuous, full operating power to the integrated circuit through selected ones of the electrically conductive tip elements, supplying electrical signals to and receiving electrical signals from the integrated circuit through the electrically conductive tip elements, and contacting a top of the integrated circuit with a cooling fluid through the probe, the cooling fluid being a liquid.

23. The integrated circuit test fixture of claim 22 additionally comprising the step of sealing the probe against the integrated circuit around a periphery of the integrated circuit.

24. The integrated circuit test fixture of claim 23 in which the liquid is vaporized while cooling the integrated circuit, the method additionally comprising the steps of collecting fluid coolant vapor from the probe, and condensing the fluid coolant vapor.

25. The integrated circuit test fixture of claim 22 in which the liquid is a fluorinated organic liquid.

26. An integrated circuit test method, which comprises holding the integrated circuit in a chuck, positioning a probe having a plurality of electrically conductive tip elements over the chuck with the tip elements electrically connected to the integrated circuit, thermally contacting the integrated circuit and the chuck with a hydrogen or helium high thermal conductivity relative to air heat transfer interface gas to reduce interface thermal resistance between the integrated circuit and the chuck while the integrated circuit is held by the chuck, supplying continuous, full operating power to the integrated circuit through selected ones of the electrically conductive tip elements, supplying electrical signals to and receiving electrical signals from the integrated circuit through the electrically conductive tip elements, and thermally contacting the integrated circuit with a cooling liquid.

27. The integrated circuit test method of claim 26 in which the integrated circuit is thermally contacted with the high thermal conductivity relative to air heat transfer interface gas through the chuck.

28. The integrated circuit test method of claim 26 in which the integrated circuit is contacted with the liquid through the probe.

29. The integrated circuit test method of claim 26 in which the liquid is a fluorinated organic liquid.

30. An integrated circuit test method, which comprises holding the integrated circuit in a chuck, positioning a probe having a plurality of electrically conductive top elements over the chuck with the tip elements electrically connected to the integrated circuit, thermally contacting the integrated circuit and the chuck with a hydrogen or helium high thermal conductivity relative to air heat transfer interface gas while the integrated circuit is held by the chuck, supplying continuous, full operating power to the integrated circuit through selected ones of the electrically conductive top elements, supplying electrical signals to and receiving electrical signals from the integrated circuit through the electrically conductive tip elements, sealing the probe against the integrated circuit around the plurality of electrically conductive tip elements and thermally contacting the integrated circuit with a cooling liquid through the probe.

31. The integrated circuit test method of claim 30 in which the cooling liquid is vaporized while cooling the integrated circuit, the method additionally comprising the steps of collecting fluid coolant vapor from the probe, and condensing the fluid coolant vapor.

32. The integrated circuit test method, which comprises holding a wafer containing the integrated circuit in a chuck, positioning a probe having a plurality of electrically conductive tip elements over the chuck with the tip elements electrically connected to the integrated circuit, thermally contacting a top of the integrated circuit with a cooling liquid while the integrated circuit is held by the chuck, supplying continuous, full operating power to the integrated circuit through selected ones of the electrically conductive tip elements, supplying electrical signals to and receiving electrical signals from the integrated circuit through the electrically conductive tip elements.

33. The integrated circuit test method of claim 32 in which the integrated circuit is contacted with the liquid through the probe.

34. The integrated circuit test method of claim 33 additionally comprising the step of sealing the probe against the integrated circuit around the plurality of electrically conductive tip elements.

35. The integrated circuit test method of claim 34 in which the cooling liquid is vaporized while cooling the integrated circuit, the method additionally comprising the steps of collecting fluid coolant vapor from the probe, and condensing the fluid coolant vapor.

36. The integrated circuit test method of claim 32 in which the liquid is a fluorinated organic liquid.

* * * * *

UNITED STATES PATENT AND TRADEMARK OFFICE
CERTIFICATE OF CORRECTION

PATENT NO. : 5,198,753
DATED : March 30, 1993
INVENTOR(S) : William R. Hamburgen It is certified that error appears in the above-identified patent and that said Letters Patent is hereby corrected as shown below:

Column 2,
Line 20, after "the" add -- invention, taken together with the drawings, in which: --.

Column 4,
Line 28, delete "noes" and insert -- ones --.
Line 43, after "comprises" add -- a vacuum --.

Column 6,
Line 11, after "gas" add -- between the integrated circuit and said chuck --.

Column 7,
Line 37, after "the" (first occurrence) add -- cooling --.

Signed and Sealed this

Third Day of January, 2006

JON W. DUDAS
*Director of the United States Patent and Trademark Office*